US006337232B1

United States Patent
Kusumoto et al.

(10) Patent No.: US 6,337,232 B1
(45) Date of Patent: Jan. 8, 2002

(54) METHOD OF FABRICATION OF A CRYSTALLINE SILICON THIN FILM SEMICONDUCTOR WITH A THIN CHANNEL REGION

(75) Inventors: Naoto Kusumoto, Kanagawa; Yasuhiko Takemura, Shiga; Hisashi Ohtani, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/325,572

(22) Filed: Jun. 4, 1999

Related U.S. Application Data (62) Division of application No. 08/844,856, filed on Apr. 23, 1997, now Pat. No. 5,940,690, which is a division of application No. 08/487,166, filed on Jun. 7, 1995, now Pat. No. 5,656,825.

(51) Int. Cl.[7] ............................................. H01L 21/265
(52) U.S. Cl. ..................... 438/151; 438/149; 438/401
(58) Field of Search ................................. 438/151, 401, 438/166, 149

(56) References Cited

U.S. PATENT DOCUMENTS

| 5,147,826 A | 9/1992 | Liu et al. |
| 5,275,851 A | 1/1994 | Fonash et al. |
| 5,306,584 A | 4/1994 | Palmer |
| 5,315,101 A | 5/1994 | Hughes et al. |
| 5,367,392 A | 11/1994 | Janai |
| 5,528,056 A | 6/1996 | Shimada et al. |
| 5,529,937 A | 6/1996 | Zhang et al. |
| 5,592,318 A | 1/1997 | Majima et al. |
| 5,625,473 A | 4/1997 | Kondo et al. |
| 5,656,825 A | 8/1997 | Kusumoto |
| 5,679,588 A | 10/1997 | Choi et al. |
| 5,696,003 A | * 12/1997 | Makita et al. ................. 437/21 |
| 5,736,751 A | 4/1998 | Mano et al. |
| 5,940,690 A | 8/1999 | Kusumoto et al. |

FOREIGN PATENT DOCUMENTS

| EP | 0 488 801 A1 | 6/1992 | |
| JP | 59-165450 | 9/1984 | |
| JP | 59-205761 | 11/1984 | |
| JP | 61-048976 | 3/1986 | |
| JP | 61-85868 | 5/1986 | .................. 257/66 |
| JP | 63-142807 | 6/1988 | |
| JP | 1-134345 | 5/1989 | .................. 257/72 |
| JP | 01-154124 | 6/1989 | |
| JP | 1-194351 | 8/1989 | .................. 257/72 |
| JP | 4-170067 | 6/1992 | .................. 257/66 |
| JP | 4-206970 | 7/1992 | |
| JP | 4-313272 | 11/1992 | .................. 257/66 |
| JP | 05-090589 | 4/1993 | |
| JP | 5-206464 | 8/1993 | |

OTHER PUBLICATIONS

"The Impact of Scaling–Down Oxide Thickness on Poly–Si Fllm Transistors' I–V Characteristics." Lin, P–S. and Li, T–S. IEEE Electron Device Lett., vol. 15, No. 4, Apr. 1994, pp. 138–139.*

"On The Psuedo–Subthreshold Characteristics of Polycrystalline–Silicon Thin–Film Transistors with Large Grain Size." Li, T–S. and Lin, P–S. IEEE Electron Device Lett., vol. 14, No. 5, May 1993, pp. 240–242.*

(List continued on next page.)

*Primary Examiner*—Richard Elms
*Assistant Examiner*—Beth E. Owens
(74) *Attorney, Agent, or Firm*—Eric J. Robinson; Nixon Peabody LLP (57) ABSTRACT

A method for forming a semiconductor device is disclosed. A semiconductor film comprising silicon is formed on a substrate. The semiconductor film is crystallized. The crystallized semiconductor film is patterned into a marker part for aligning a mask and an insular semiconductor part at the same time. A part of the semiconductor film to become a channel formation region is thinned to a thickness 300 Å or less.

21 Claims, 9 Drawing Sheets

OTHER PUBLICATIONS

High Performance Low Temperature Polysilicon Thin Film Transistor Using ECR Plasma Thermal Oxide as Gate Insulator. Lee, J–Y; Han, C–H and Kim, C–K. IEEE Electron Device Lett., vol. 15, No. 8, Aug. 1994, pp. 301–303.*

"ECR Plasma Oxidation Effects on Performance and Stability of Polysilicon Thin Film Transistors." Lee, J–Y; Han, C–H. and Kim, C–K. IEDM 1994, pp. 20.3.1–20.3.4.*

C. Hayzelden et al., "In Situ Transmission Electron Microscopy Studies of Silicide–Mediated Crystallization of Amorphous Silicon" (3 pages), 10/91.

A.V. Dvurechenskii et al., "Transport Phenomena in Amorphous Silicon Doped by Ion Implantation of 3d Metals", *Akademikiam Lavrentev Prospekt* 13, 630090 Novosibirsk 90, USSR, pp. 634–640, 1986.

T. Hempel et al., "Needle–Like Crystallization of Ni Doped Amorphous Silicon Thin Films", *Solid State Communication*, vol. 85, No. 11, pp. 921–924, 1993.

"Crystallized Si Films by Low–Temperature Rapid Thermal Annealing of Amorphous Silicon", R. Kakkad, et al., J. Appl. Phys. 65 (5), Mar. 1, 1989, 1989 American Institute of Physics, p. 2069–2072.

"Polycrystalline Silicon Thin Film Transistors on Corning 7059 Glass Substrates Using Short Time, Low Temperature Processing", G. Liu, et al., Appl. Phys. Lett. 62 (20), May 17, 1993, 1993 American Institute of Physics, p. 2554–2556.

"Low Temperature Selective Crystallization of Amorphous Silicon", R. Kakkad et al., Journal of Non–Crystalline Solids, vol. 115, (1989), p. 66–68.

"Selective Area Crystallization of Amorphous Silicon Films by Low–Temperature Rapid Thermal Annealing", Gang Liu, et al., Appl. Phys. Lett. 55 (7), Aug. 14, 1989, 1989 American Institute of Physics, p. 660–662.

* cited by examiner

PHOSPHORUS ION

METHOD OF FABRICATION OF A CRYSTALLINE SILICON THIN FILM SEMICONDUCTOR WITH A THIN CHANNEL REGION

This application is a divisional application of application Ser. No. 08/844,856, filed Apr. 23, 1997, now U.S. Pat. No. 5,940,690, which is a divisional application of application Ser. No. 08/487,166, filed Jun. 7, 1995, now U.S. Pat. No. 5,656,825.

FIELD OF THE INVENTION

The present invention relates to the structure of a thin film insulated gate type semiconductor device (thin film transistor, or TFT) formed on an insulating surface and a production method for the same. A semiconductor device according to the present invention is used for active matrices of liquid crystal displays or the like, driving circuits of image sensors or the like, SOI integrated circuits and conventional semiconductor integrated circuits (microprocessors, microcontrollers, microcomputers or semiconductor memories, etc).

BACKGROUND OF THE INVENTION

In recent years, much research has been being carried out into forming an insulated gate type semiconductor device (MISFET) on an insulating substrate or on a surface separated from a semiconductor substrate by a thick insulating film (an insulating surface). In particular, a semiconductor device in which a semiconductor layer (active layer) is of a thin film form is called a thin film transistor (TFT). In such a semiconductor device, it is difficult to obtain an element having such good crystallinity as that of a single crystal semiconductor, and usually a non-single crystal semiconductor which is not single crystal but has crystallinity has been employed.

Such a non-single crystal semiconductor has inferior characteristics as compared with a single crystal semiconductor. In particular, there has been the problem that when a reverse voltage (that is, a negative voltage in case of an N channel type TFT and a positive voltage in case of a P channel type TFT) is applied to gate electrodes, a leak current between a source and a drain is increased. This problem has been fatal particularly when a TFT is used for a switching transistor of an active matrix circuit.

It has been reported that this problem can be solved by thinning a semiconductor layer (active layer) in which channels are formed in a TFT. For example, Hisao Hayashi et al report in Jpn. J. Appl. Phys. vol. 23 (1984) L819 that they studied how the characteristics of a TFT were affected when the thickness of an active layer of crystalline silicon was changed from 100 Å to 1000 Å and obtained the desirable characteristic that as the active layer gets thinner, electric field effect mobility increases, and threshold voltage and leak current decrease.

According to this report, however, the electric field effect mobility was very low, 10 cm$^2$/Vs at maximum, and accordingly while the above TFT could be used for a switching transistor for an active matrix circuit, it was impossible to use the TFT for a circuit for driving the active matrix circuit. According to this report, a film obtained in an as-depo state was utilized for a crystalline silicon film, and it did not have preferred crystallinity.

On the other hand, a method in which crystal growth is effected by heat annealing (solid phase growth method, SPC) and a method in which crystallization is carried out through a liquid phase state or in a solid phase by irradiating with a laser or strong light equivalent to a laser (photo annealing) has been known as methods for obtaining a semiconductor film having good crystallinity from a non-single crystal semiconductor. For example, to obtain a silicon film from non-single crystal silicon by heat annealing it has been necessary to heat an amorphous silicon film at 500 to 650° C.

However, because of influences exerted by the substrate (including a base), it has not been possible to obtain good crystallinity by these methods without using a silicon film having a thickness of at least 500 Å.

SUMMARY OF THE INVENTION

The present invention has been made in view of these kinds of problem, and an object thereof is to provide a TFT with which better characteristics can be obtained using a good crystalline silicon film.

Another object is to provide a preferable constitution of a semiconductor integrated circuit produced using a TFT having such good characteristics.

The present invention is characterized in that after an amorphous semiconductor film having a thickness of 400 Å or more is crystallized by heat annealing or photo annealing or the combined use thereof, this is wholly or selectively etched to prepare a thin crystalline semiconductor film having a thickness of 300 Å or less and this is used as an active layer (a part where channel-forming regions are formed, that is, a part on which gate electrodes are formed) in a TFT.

The present invention is characterized by the thickness of an active layer, and hereinafter the thickness means the average thickness of the prescribed region unless otherwise indicated. In a polycrystalline material, irregularities are formed thereon by the presence of grain boundaries or the like and the film thickness is sometimes abnormally small or large in places for some reason. However, since such abnormal parts will not exert influences on elements and the whole circuit, they may be ignored. It is for such reasons that attention is paid to the average thickness of the specific parts in the present invention.

The present invention is characterized as well in that the crystallinity of the semiconductor film of the active layer is excellent, and it is different from a conventional TFT in that sense. However, it is very difficult to discuss objectively crystallinity. Accordingly, excellence in crystallinity of a semiconductor film will be evaluated by the electric field effect mobility of a TFT produced therewith. While the electric field effect mobility varies depending on the gate voltage and other conditions, the maximum value thereof is considered to reflect objectively the crystallinity of the active layer in the TFT, and therefore it is suited for the evaluation. In the present invention, there can be obtained a silicon film having crystallinity sufficient to obtain the characteristic of a maximum electric field effect mobility of typically 50 cm$^2$/Vs or more, preferably 100 cm$^2$/Vs or more, and having a thickness of 300 Å or less.

In the present invention, two methods can be employed for the etching process described above when silicon is used as a semiconductor. The first method is characterized in that a process in which a silicon film is slightly oxidized to form a silicon oxide film and this is etched and repeated as many times as necessary. This method is excellent in controllability of etching depth as compared with a method in which a silicon film is directly dissolved by etching.

Oxidation can be carried out by heat oxidation, anodic oxidation or an oxidizing agent in order to carry out oxidation in the above process. Since the thickness of the silicon film oxidized is determined by temperature or voltage and time in heat oxidation or anodic oxidation, it can very uniformly be controlled even when a large substrate is processed. The case where an oxidizing agent is used is the same. When an oxidizing agent is used, solutions of nitric acid, hydrogen peroxide, perchlorate and permanganate can be used as the oxidizing agent. For example, a mixed solution of hydrogen peroxide and ammonia can carry out oxidation very stably.

After forming a thin silicon oxide film by the above method, the silicon oxide film formed on the surface is etched by exposing the silicon film to an etchant which does not etch silicon (for example a solution of a hydrogen fluoride such as 1% hydrofluoric acid or the like). This results in causing the silicon film to get thin only by the oxidized part. The problem with this method is that the necessity to repeat the process means that a longer time is taken as the depth to be etched becomes greater.

The second method is a method in which etching is carried out using a solution containing a component also positively etching silicon oxide in addition to an oxidizing agent. It is different from the first method in that the process is finished in one stage, and accordingly it is excellent in terms of it suitability for mass production. Solutions prepared by adding hydrofluoric acid to an oxidizing agent such as hydrogen peroxide or nitric acid can be used as the solution. The concentration of hydrofluoric acid and the addition amount of a buffer solution (acetic acid or the like) added can be selected to adjust the etching rate. However, etching depth will vary greatly if the components and temperature of the solution and the etching time, etc are not precisely controlled. Difficulty in precisely controlling the depth is a problem.

As described above, it can be decided considering the suitability for mass production and the precise controllability or the like which of the first method and the second method is selected.

In the present invention, the operation of etching a silicon film for thinning by the process described above may be carried out on the whole substrate, but it is more effective to carry it out only on necessary parts. Since the operation described above is required for the parts where channels in a TFT are formed, the thinning described above can be carried out on the regions including the parts on which gate electrodes are formed (channel-forming regions). Reversely, since it is advantageous that a silicon film having a certain amount of thickness is present in the regions where source and drain electrodes are provided in terms of forming contact holes, the thinning described above is preferably avoided.

When a plurality of TFT's are present, the application of the above thinning particularly in a circuit of which low leak current is required (for example, a switching transistor for an active matrix circuit) and a circuit in which a small ON-state current is acceptable provides a large effect.

The present invention is very effective when heavy metals such as nickel, palladium, platinum, cobalt and iron are incorporated in order to promote crystallization. These heavy metal elements function as catalysts in crystallization by heat annealing in an amorphous silicon film, and they are effective in terms of shortening heat annealing time and lowering heat annealing temperatures. However, remaining of these elements in the silicon exerts an adverse influence on various TFT characteristics. In particular, it is estimated that leak current is generated with these elements as trap centers, and removal of these elements has been a topic. These elements are liable to segregate at an interface between a silicon film and another film. In particular, it was not preferable that these elements existed at an interface between a silicon film and a gate insulating film.

However, since the parts where the concentrations of these elements are large are etched as well in the silicon oxide etching process if thinning of an active layer is carried out by the above process, the concentrations of these elements for promoting crystallization can be reduced.

Figure 11A:
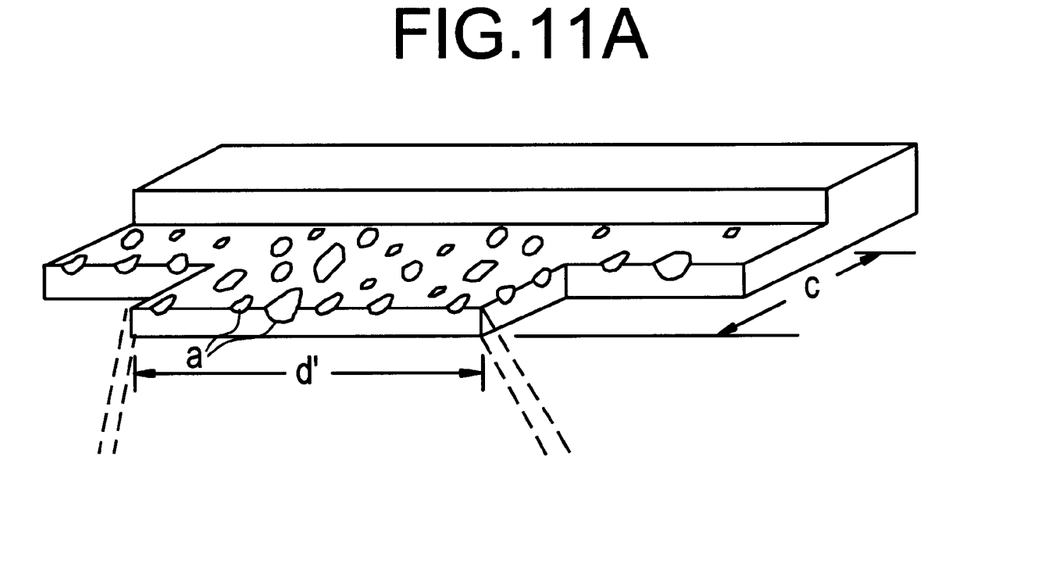
FIGS. 11(A) to 11(B) show a perspective view of an etching example according to the present invention.
Figure 11B:
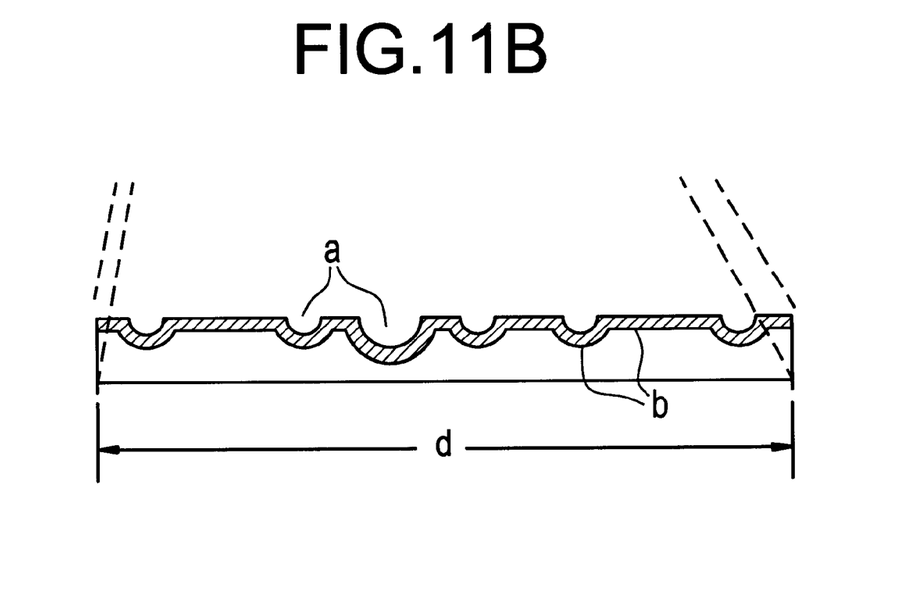

In this, the regions of the thinned silicon active layer region c are where the concentrations of nickel and the like are high selectively etched as shown in FIG. 11, and a lot of holes a are formed (FIGS. 11(A) and (B)).

That results in an increase in the cross-sectional area b of the channel, and the actual channel width a becomes larger than the geometric channel length d. This is convenient for a TFT of which a large ON current is required (FIG. 11(B)).

The present invention is more effective in suppressing leak current if it is applied to a TFT of an offset gate structure wherein the gate electrode is not superposed on either or one of the source and the drain.

In the present invention, all or a part of the source and drain becomes resultingly very thin, and that causes resistance in the source/drain to become very high. This rarely becomes a problem in a circuit requiring the present invention (for example, a switching transistor for an active matrix circuit); however, if the resistance in the source and drain becomes a problem, it is effective and necessary to sufficiently activate N type and P type impurity elements. For this it is effective to carry out activation using a combination of photo annealing and heat annealing. For example, after carrying out activation by irradiation with laser light, activation may beneficially be further carried out by heat annealing at 500 to 650° C.

Because the thickness of an active layer becomes very thin in the present invention, a pulse laser having a pulse width of 10 msec or less is preferable to a continuous oscillation laser.

Because a channel-forming region is formed very thinly in the present invention, a gate insulating film of 500 Å or less may be deposited by CVD such as plasma CVD, reduced pressure CVD, atmospheric pressure CVD or ECR (electronic cyclotron resonance), or sputtering. This results in improvement in the electric field effect mobility, threshold voltage and rise characteristics (subthreshold characteristic and S value).

Conventionally, a thickness of a gate insulating film of 500 Å or less has been possible in an MOS device formed on a single crystal semiconductor wafer. This is because of the following two reasons. The first is that on a single crystal wafer a level difference at a part moving from a channel forming region to field insulating matter was very gentle on a single crystal wafer owing to a so-called LOCOS technique or the like. The second is that an oxide film used as a gate insulating film was obtained by heat oxidation and had excellent covering performance. A very thin gate insulating film was possible because of these two reasons.

However, a TFT was very disadvantageous in terms of the gentle level difference mentioned in the first point above. That is, a thickness of 500 Å or more was required in an active layer. Further, it was impossible also in the second point to obtain a gate insulating film having a sufficient thickness by heat oxidation except where heat oxidation was carried out particularly by a high temperature process of 850° C. or higher. When heat oxidation could not be employed, a non-heat oxidation method such as CVD or sputtering was inevitably employed, but a problem on a covering performance of a level difference was always involved in these methods. As a result, it has been thought that it is impossible to set a thickness of a gate insulating film to 500 Å or less. However, these difficulties have been solved by the present invention.

By having set a thickness of an active layer to 300 Å or less, the covering performance of the level difference has been almost no problem even if the gate insulating film is 500 Å or thinner. In particular, an effect for making it possible to thin the gate insulating film is equal to the case of forming the gate insulating film by sputtering. A silicon oxide film which is very close to a heat oxidation film is obtained by sputtering, but sputtering has rarely been employed because the film-forming speed thereof is slow as compared with that of CVD. However, since the gate insulating film can be thinner than the conventional film, it has become possible for sputtering to compete with CVD in this regard.

In the present invention, there is also an effect that irregularities formed on an initial surface of a heavily uneven silicon film can be relieved. For example, a very heavily rough surface was formed when a laser was used with the silicon film exposed, and it was an obstacle against a covering performance of a level difference in a gate insulating film. However, it can be solved by the present invention. This is done by a process for thinning a silicon film in the present invention. For example, irregularities of about 500 Å in a process in which oxidation is carried out by a mixed solution of hydrogen peroxide and ammonia and etching is carried out by hydrofluoric acid is finally reduced to such an extent as can be almost ignored. This effect of reducing irregularities varies depending on the etchant used, and the etchant can be selected according to a required level of irregularity reduction.

DETAILED DESCRIPTION OF THE PREFERRED EMBODIMENTS

Preferred Embodiment 1

The present preferred embodiment is shown in FIGS. 1(A) to 1(F). First, a silicon oxide film 102 was formed to 1000 to 5000 Å, for example 4000 Å on a substrate 101 (Corning 7059, 100 mm×100 mm) as a base oxide film by sputtering. This silicon oxide film 102 is provided in order to prevent impurities from diffusing from the glass substrate. Then, an amorphous silicon film 103 was formed to 400 to 1500 Å, for example 500 Å by plasma CVD.

Thereafter, a layer 104 (nickel-containing layer) containing nickel or a nickel compound of several to several tens of Å was formed on the amorphous silicon film 103. The nickel-containing layer 104 can be formed by any of:

(1) a method in which a solution containing nickel is coated and then dried;
(2) a method in which a nickel or nickel compound film is formed by sputtering; and
(3) a method in which gaseous organic nickel is decomposed and deposited by heat, light or plasma (a gaseous phase growth method). In the method (1), the solution can be coated by, for example, spin coating, or dipping. In the present preferred embodiment, a nickel acetate film was formed by spin coating. This method will be described below in detail.

First, a silicon oxide film is formed to 10 to 50 Å on the amorphous silicon film by oxidizing a silicon surface. The silicon oxide film can be formed by irradiation with UV rays in an oxygen atmosphere, heat oxidation or treatment with hydrogen peroxide, etc. Here, the oxide film was formed to 20 Å by irradiation with UV rays in an oxygen atmosphere. This silicon oxide film is for spreading a nickel acetate solution over the whole surface of the amorphous silicon film in a later process of coating the nickel acetate solution, that is, for improving the surface characteristics of the silicon film and making it not repel an aqueous solution.

Next, nickel was dissolved in an acetate solution to prepare a nickel acetate solution, wherein the concentration of nickel was set to 10 ppm. Then, 2 ml of this nickel acetate solution was dropped onto the surface of the substrate while the substrate was rotated, and this state was maintained for 5 minutes to spread the nickel acetate solution evenly over the substrate. Then, the speed was raised to carry out spin drying (2000 rpm, 60 seconds).

According to researches by the present inventors, a concentration of nickel of 1 ppm or more in the acetate solution is sufficient for practical use. A nickel acetate layer having an average thickness of 20 Å could be formed on the surface of the amorphous silicon film after spin drying by carrying out this coating process of the nickel acetate solution once or more times. This layer does not necessarily form a complete film. The layer can be formed in the same manner using other nickel compounds. Thus, a nickel acetate film 104 was formed. (FIG. 1(A)).

In the present preferred embodiment, a method in which nickel or a nickel compound is introduced on the amorphous silicon film was shown, but alternatively there may be employed a method in which nickel or a nickel compound is introduced under the amorphous silicon film (that is, between the base oxide film 102 and the silicon film 103).

In this case, the nickel or nickel compound can be introduced before forming the amorphous silicon film.

After the nickel-containing layer was formed, heat treatment was carried out to effect crystallization at 550° C. for 4 hours in a nitrogen atmosphere in a heating furnace. Most of the amorphous silicon was crystallized by this heat annealing, but areas of amorphous silicon remained in places. Accordingly, irradiation with KrF excimer laser light (wavelength 248 nm) was carried out to crystallize these incompletely crystallized areas. The energy density of the laser was set to 200 to 350 mJ/cm$^2$. The energy density of the laser can be determined considering the thickness and the degree of crystallization of the silicon film.

Figure 1A:
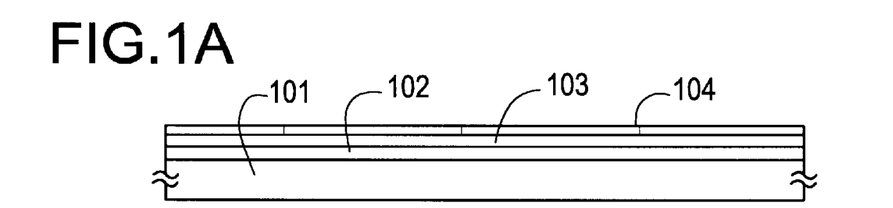
FIGS. 1(A) to 1(F) show a production method of a TFT circuit according to the present invention (cross-sectional drawing, Preferred Embodiment 1)
Figure 1B:
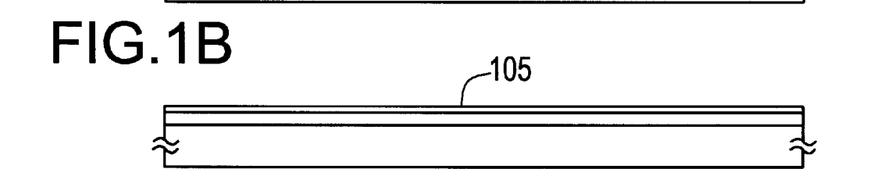

Then, as shown in FIG. 1(B), the crystalline silicon film was etched to a film thickness of 150 to 300 Å. This etching process was carried out by first oxidizing the surface of the crystalline silicon film with a mixed solution of hydrogen peroxide and ammonia to form silicon oxide and then removing the silicon oxide film with hydrofluoric acid. Since about 50 to 120 Å is etched each time in this process, the same operation was repeated several times to achieve etching of the required thickness. A mixed solution prepared by mixing hydrogen peroxide, ammonia and water in the ratio 5:2:2 was used, but solutions having other mixing ratios can be used. Besides these, nitric acid may be used, and the surface of the crystalline silicon film may be etched with hydrofluoric acid after being thermally oxidized.

Next, the crystalline silicon film 105 thus obtained was etched by dry etching to form an insular region 106 (insular silicon film). This insular silicon film 106 constitutes an active layer in a TFT. Then, as a gate insulating film, a silicon oxide film 107 having a film thickness of 200 to 1500 Å, for example 500 A was formed by sputtering.

Figure 1C:
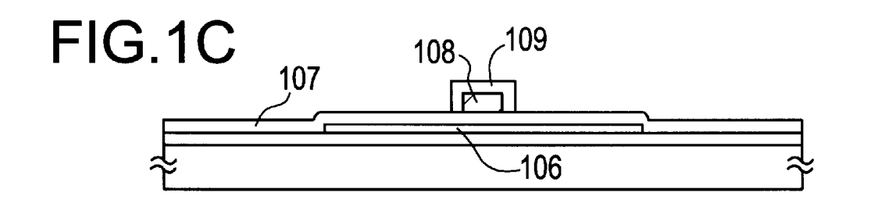

As shown in FIG. 1(C), an aluminum (containing Si 1 wt % or Sc 0.1 to 0.3 wt %) film having a thickness of 1000 Å to 3 mm, for example 5000 Å was formed by sputtering, and this was patterned to form a gate electrode 108. Next, the substrate was dipped in a 1 to 3% ethylene glycol solution of tartaric acid of pH about 7, and anodic oxidation was carried out with platinum as a cathode and the aluminum gate electrode 108 as an anode. Anodic oxidation was finished after initially raising the voltage up to 220 V at a fixed current and maintaining this voltage for one hour. Thus, an anodic oxide film 109 having a thickness of 1500 to 3500 Å, for example 2000 Å was formed.

Figure 1D:
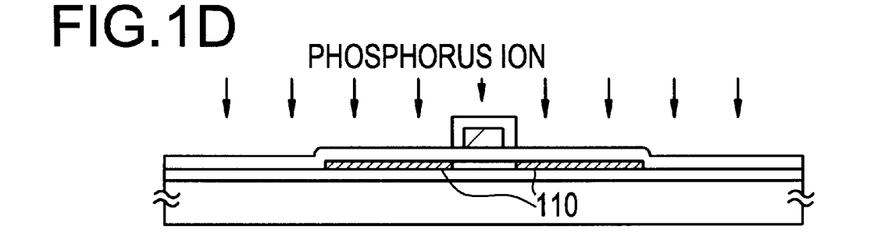

As illustrated in FIG. 1(D), an impurity (phosphorus in the present preferred embodiment) was then injected into the insular silicon film 106 by ion doping with the gate electrode 108 and the anodic oxide film 109 as masks. Phosphine gas (PH$_3$) was used as the doping gas. On this occasion, the dose amount was set at $1 \times 10^{13}$ to $5 \times 10^{15}$ atoms cm$^{-2}$, and the accelerating voltage to 10 to 90 kV, for example, the dose amount to $5 \times 10^{14}$ atoms cm$^{-2}$ and the accelerating voltage to 80 kV. This resulted in an N type impurity region 110 (source/drain) being formed.

A KrF excimer laser (wavelength: 248 nm, pulse duration: 20 nsec) was then used to activate the doped impurity region 110. The suitable energy density of the laser was 200 to 400 mJ/cm$^2$ and preferably 250 to 300 mJ/cm$^2$. This process may be carried out by heat annealing at 350 to 500° C.

Figure 1E:
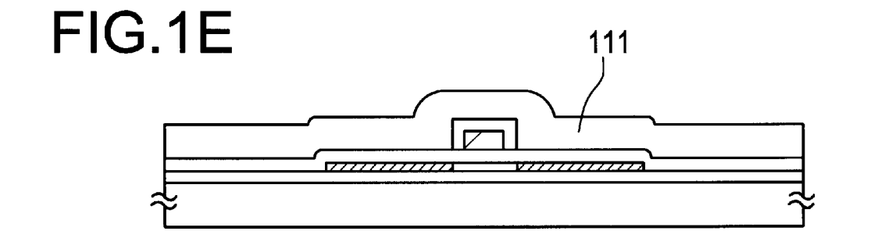

Next, as illustrated in FIG. 1(E), a silicon oxide film 111 was formed as an interlayer insulating film to a thickness of 3000 Å by plasma CVD.

Figure 1F:
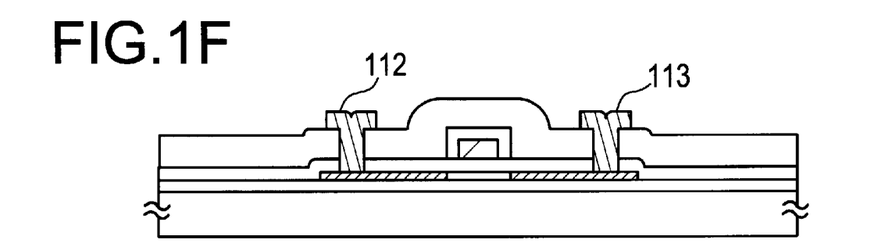

The interlayer insulating film 111 and the gate insulating film 107 were then etched to form contact holes to the source and the drain. Then, as shown in FIG., 1(F), a titanium nitride film thickness 1000 Å and an aluminum film (thickness 5000 Å) were formed by sputtering and etched to form source and drain electrodes 112 and 113, whereby the TFT circuit was completed.

After preparing the TFT, hydrogenation treatment may further be carried out at 200 to 400° C. When the thickness of the active layer at the contacts to the source and the drain is very thin as is the case with the present preferred embodiment, the direct contact of aluminum to silicon leads to a high possibility that alloying will cause imperfect contact. In order to avoid this, a titanium nitride or other film which is electroconductive and does not readily react with silicon or aluminum can be provided between the aluminum and the silicon.

Figure 5:
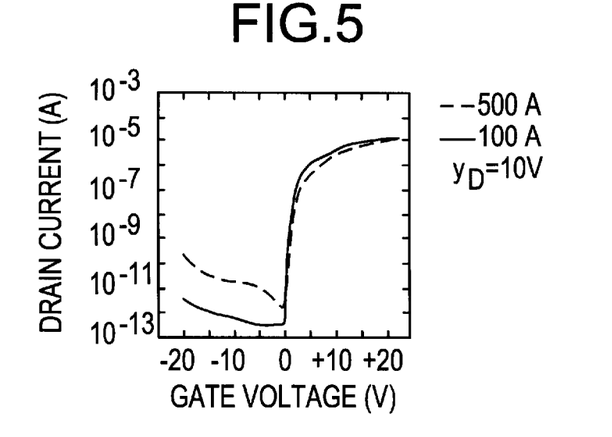
FIG. 5 shows a $I_D$–$V_G$ characteristic example of a TFT according to the present invention (Preferred Embodiment 1)
Figure 6:
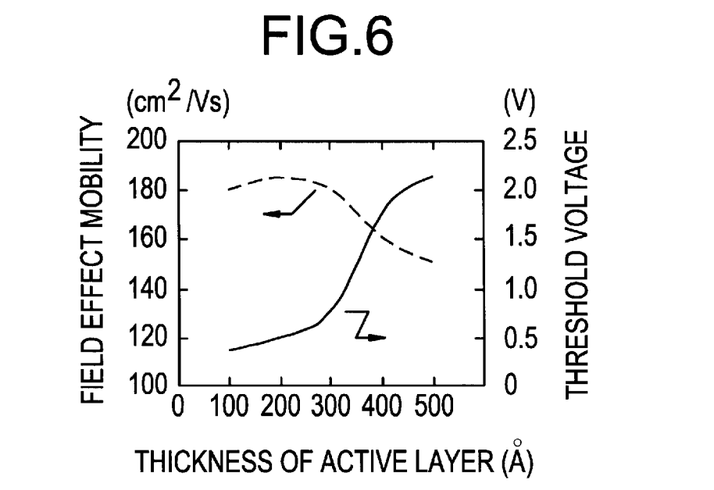
FIG. 6 shows an example of electric field effect mobility of a TFT according to the present invention; (Preferred Embodiment 1)

In the present preferred embodiment, the thickness of the active layer was changed from 100 Å to 500 Å and the characteristics thereof measured. Examples of the drain current ($I_D$)-gate current ($V_G$) characteristics in an active layer which was thinned (100 Å) according to the preferred embodiment described above and one obtained by a conventional method (500 Å) are shown in FIG. 5. It can be seen from this graph that the thinning of the active layer produced a large difference in the characteristic of the leak current of when a reverse bias (negative) voltage was applied to the gate electrode.

Figure 7:
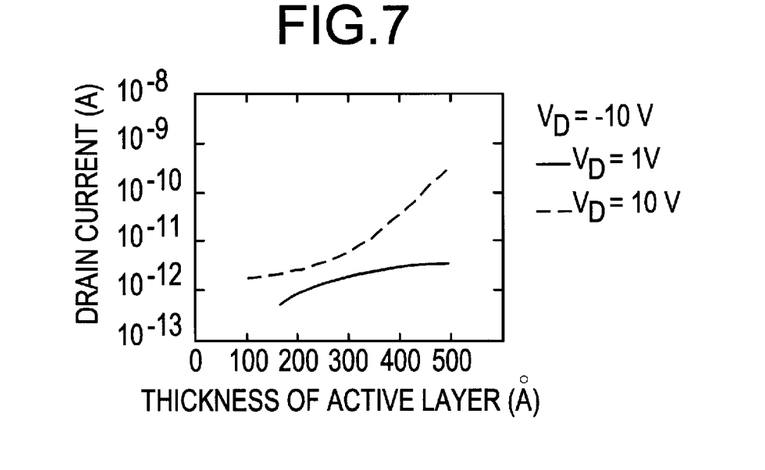
FIG. 7 shows an example of leak current of a TFT according to the present invention; (Preferred Embodiment 1)

The leak current was measured in further detail and is shown in FIG. 7. In particular, it can be seen that the leak current at $V_D$=10V is markedly reduced by thinning the active layer. This was desirable as a switching transistor for an active matrix circuit of which low leak current is required when a high voltage is applied across the source/drain.

In addition, electric field effect mobility and threshold voltage were measured as well, and it was confirmed that the former becomes larger and the latter smaller as the active layer becomes thinner. It was confirmed that in all cases, sudden change takes place in a thickness of the active layer ranging between 300 to 400 Å.

Preferred Embodiment 2

A case where a silicon layer is selectively thinned will be described in the present preferred embodiment. The whole of the silicon layer was thinned in a case of Preferred Embodiment 1. In this case, there was the problem that a different film had to be formed as a marker for aligning a mask as well as the problem that the margin for overetching is hard to keep when the contact holes to the source and drain are formed. In particular, this was a large obstacle when a top gate type TFT (a gate electrode is present on an active layer) was formed.

To describe this problem in detail, conventionally, in a process for forming elements by superposing films on a transparent substrate, a pattern of some film has generally been made a marker at an initial stage and used, in a later process for aligning the mask. A silicon film was generally used as a film for forming the marker in the top gate type TFT. That is, because the pattern formation which is done at first is the formation of an insular region in the process for the top gate type TFT. In forming this insular region, the marker for adjusting the mask is formed at the same time. Thereafter, the marker which is formed on this occasion is used in all the processes for aligning the mask. This marker caused several problems as the silicon film got thinner. In particular, when patterns were formed on an aluminum film, it was necessary to distinguish a level difference between the marker part and the aluminum film to align the mask, but when the silicon film was thinned to 500 Å or less, it became impossible to confirm a sufficient level difference, and failure became liable to occur in the mask-adjusting process.

Figure 2A:
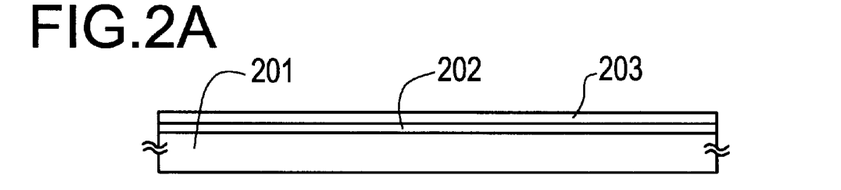
FIGS. 2(A) to 2(F) show a production method of a TFT circuit according to the present invention (cross-sectional view, Preferred Embodiment 2)

As illustrated in FIG. 2(A), in addition to improvement in the TFT characteristics, an improved method will be shown as well in the aspect of mask alignment. The present preferred embodiment is shown in FIG. 2. First, a silicon oxide film 202 was formed to 1000 to 5000 Å, for example 2000 Å on a transparent glass substrate 201 as a base oxide film by sputtering. This silicon oxide film is provided in order to prevent impurities from diffusing from the glass substrate. Then, an amorphous silicon film was formed to 500 to 1500 Å, for example 800 Å by plasma CVD. It is for securing a thickness which makes it possible to sufficiently confirm the marker during mask alignment that the thickness of the silicon film was set to 800 Å here.

Further, a silicon oxide film 204 was formed to 500 Å on the crystalline silicon film. Silicon nitride may be substituted for the silicon oxide. This silicon oxide film 204 will become a cap film in later heat annealing. Thereafter, the amorphous silicon film was crystallized by heat annealing at 500 to 650° C. In this step, nickel or the like may be added as a catalyst element for promoting crystallization as shown in Preferred Embodiment 1. Also, a KrF excimer laser may be used for improving crystallization after the heat annealing process.

Figure 2B:
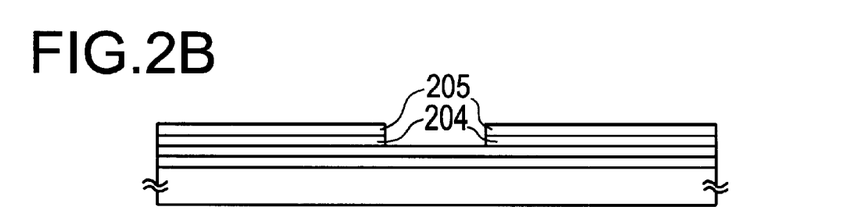
Figure 4A:
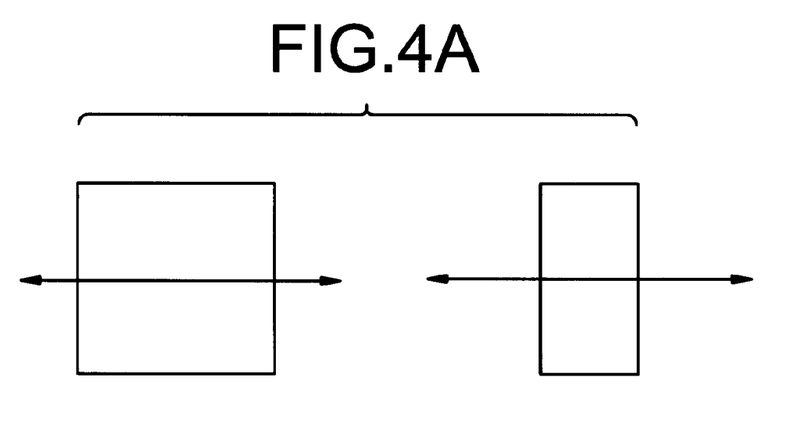
FIGS. 4(A) to 4(C) show a production method of a TFT circuit according to the present invention (top view, Preferred Embodiment 2)

Then, a photoresist 205 was formed on the silicon oxide film and patterning was carried out, whereby a mask was formed so that adjacency of the channel region formed could be etched. A cross-sectional drawing of this state is shown in FIG. 2(B), and a view seen from above in FIG. 4(A). In the present preferred embodiment, two patterns consisting of first pattern and a second pattern were formed and compared. The arrow shown in FIG. 4(A) shows the direction of the cross section in FIG. 2.

Figure 2C:
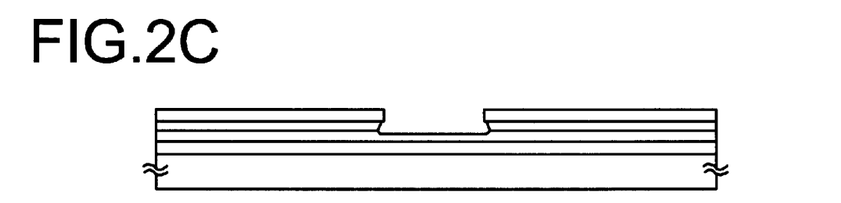

Thereafter, as illustrated in FIG. 2(C), the silicon film was etched in the same manner as that in Preferred Embodiment 1 to form a film to a thickness of 150 to 300 Å in the periphery of a channel-forming region. On this occasion, oxidation with a mixed solution of hydrogen peroxide and ammonia and etching with 1% hydrofluoric acid were alternately carried out to etch the silicon film to the required thickness.

Figure 4B:
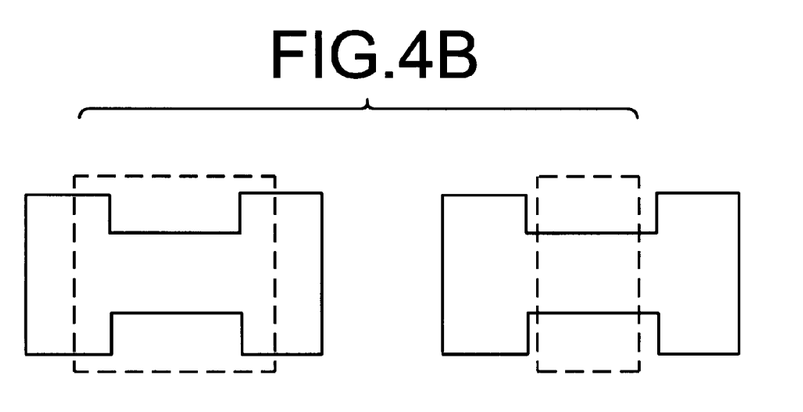

Then, the photoresist 205 and the silicon oxide film 204 were removed. Next, the crystalline silicon film thus obtained was etched to form an insular region 206 (insular silicon film) for forming a TFT and the markers 207 and 208 for aligning a mask. A view seen from above at this time is shown in FIG. 4(B). In this drawing, the pattern of thinning of the above silicon film is shown as well in dotted lines. In the first pattern (FIG. 4(B), left side), this resulted in the shape of the region of the thin silicon film becoming almost an H form. In the second pattern, the shape of the region of the thin silicon film was rectangular. In the second pattern, the constricted part of the insular region was sometimes broken by abnormal etching when etching the insular region was etched, but such a phenomenon was not observed in the first pattern.

Figure 2D:
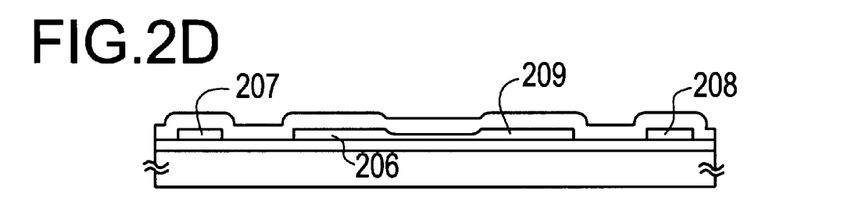

Thereafter, as shown in FIG. 2(D), a silicon oxide film 209 having a film thickness of 200 to 1500 Å, for example 1000 Å was formed as a gate insulating film by plasma CVD.

Figure 4C:
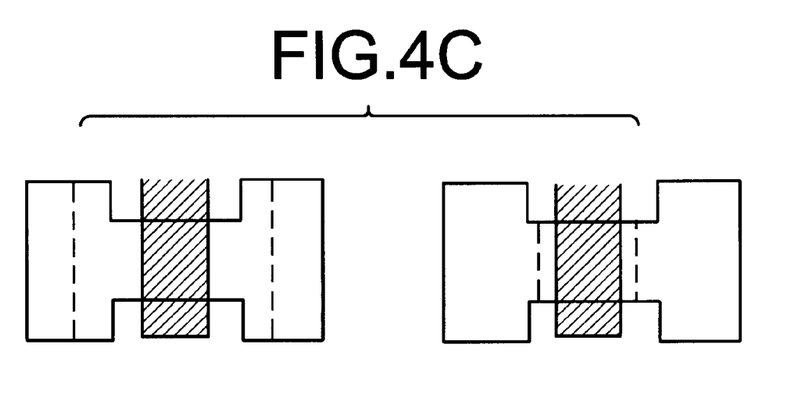

A polycrystalline silicon film of thickness 1000 Å to 3 μm, for example 5000 Å and doped with phosphorus was then formed by reduced pressure CVD, and this was patterned to form the pattern of a photoresist corresponding to a gate electrode interconnector. The marker 207 was used for this. Then, the polycrystalline silicon film was etched with the pattern of this photoresist to form a gate electrode 210. A view seen from above at this time is shown in FIG. 4(C).

Figure 2E:
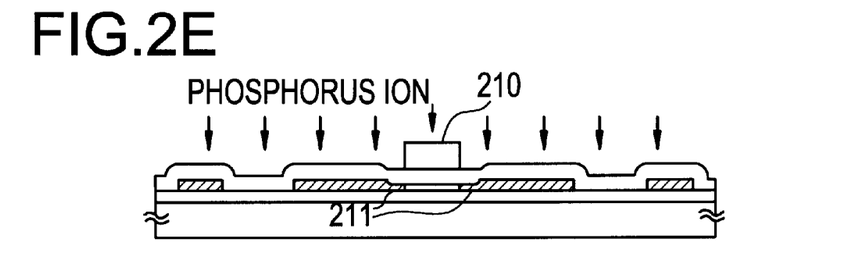

Then, as shown in FIG. 2(E), an impurity (phosphorus in the present example) was injected in a self-aligned manner into the insular silicon film 206 with the gate electrode 210 as a mask by ion doping. $PH_3$ was used as the doping gas. On this occasion, the dose amount was set to $1 \times 10^{13}$ to $5 \times 10^{15}$ atoms cm$^{-2}$, and the accelerating voltage to 10 to 90 kV, for example the dose amount to $1 \times 10^{15}$ atoms cm$^{-2}$ and the accelerating voltage to 80 kV. This resulted in an N type impurity region 211 (source/drain) being formed.

Heat annealing was then carried out at 500 to 650° C., for example 600° C. to activate the doped impurity.

A silicon oxide film 212 was then formed to a thickness of 3000 Å as an interlayer insulating film by reduced pressure CVD.

Figure 2F:
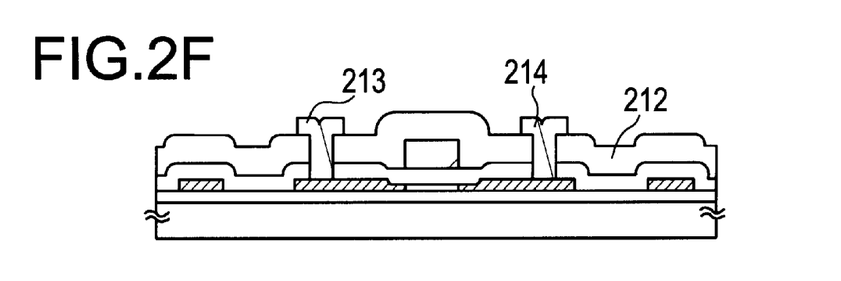

The interlayer insulating film 212 and the gate insulating film 209 were etched to form contact holes to the source and the drain. On this occasion, the contact holes were easy to form unlike Preferred Embodiment 1, because the source and drain regions were thick, at 800 Å. Then, an aluminum film was formed by sputtering and patterned to form the pattern of a photoresist corresponding to a source/drain electrode interconnector. The marker 208 was used for this. As shown in FIG. 2(F), the aluminum film was then etched with the pattern of this photoresist to form source/drain electrode/interconnectors 213 and 214.

After forming the TFT, hydrogenated treatment at 200 to 400° C. may further be carried out.

Since the TFT thus obtained was thin in the periphery of the channel-forming region in the semiconductor layer as compared with conventional TFTS, a TFT having no big difference from Preferred Embodiment 1 in the characteristics such as electric field effect mobility, threshold voltage, leak current and the like could be obtained. On the other hand, since the silicon film of the marker had a sufficient thickness, failure in the mask alignment could be reduced. Also, since the source and the drain had a thickness of 800 Å, sheet resistance was sufficiently low. Since the source and the drain had a sufficient thickness, a defective contact did not occur at the source and the drain even though a titanium nitride film was not provided.

Preferred Embodiment 3

The present Preferred Embodiment is shown in FIGS. 3(A) to 3(G). The present Preferred Embodiment shows an example in which the present invention was applied to the production of a CMOS element and a switching transistor (pixel TFT) for an active matrix each used for a shift register circuit in the peripheral circuit of a TFT type liquid crystal display unit.

First, a silicon oxide film 302 was formed as a base oxide film to 1000 to 5000 Å, for example 1000 Å on a substrate 301 by sputtering. Then, an amorphous silicon film was formed to 400 to 1500 Å, for example 500 Å by plasma CVD.

Figure 3A:
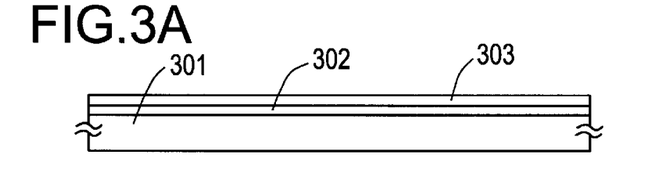
FIGS. 3(A) to 3(G) show a production method of a TFT circuit according to the present invention (cross-sectional drawing, Preferred Embodiment 3)

Thereafter, as shown in FIG. 3(A), a nickel-containing layer of several to several tens of Å was formed on the amorphous silicon film by spin coating in the same manner as that in Preferred Embodiment 1. After forming the nickel-containing layer, heat treatment was carried out at 550° C. for 4 hours in a heating furnace in a nitrogen atmosphere to crystallize the layer. Irradiation with a KrF excimer laser ray having an energy density of 200 to 350 mJ/cm$^2$ was then carried out to improve crystallization.

Figure 3B:
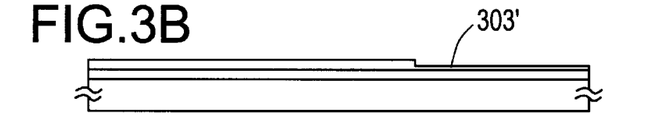

Next, as shown in FIG. 3(B), a mask was formed on the crystalline silicon film 303 thus obtained in the same manner as that in Preferred Embodiment 2, and only the region of an active matrix circuit was thinned to form a thin silicon region 303'. The thickness of the silicon film in the region 303' was set to 300 Å. Etching was carried out by the same method as that in Preferred Embodiment 2.

Figure 3C:
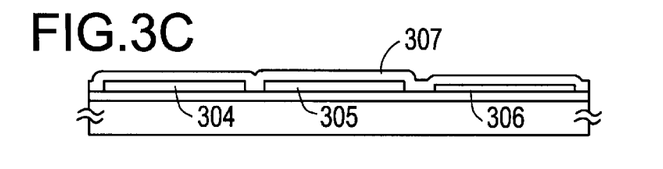

Then, as shown in FIG. 3(C), the crystalline silicon film thus obtained was patterned to form insular regions 304, 305 and 306 (insular silicon film). These insular regions 304, 305 and 306 are the active layers in a TFT. The former two are used for a circuit of a shift register in a peripheral driving circuit, and the latter is used for a pixel TFT for the active matrix circuit. Further, a silicon oxide film 307 having a film thickness of 200 to 1500 Å, for example 1000 Å was formed as a gate insulating film 307 by plasma CVD.

Then, an aluminum film having a thickness of 1000 Å to 3 mm, for example 5000 Å was formed by sputtering and patterned to form the gate electrodes 308, 309 and 310. Next, the substrate was dipped in a 1 to 3% ethylene glycol solution of tartaric acid of pH about 7, and anodic oxidation was carried out with platinum as a cathode and the aluminum gate electrodes 308, 309 and 310 as anodes. Anodic oxidation was finished after initially raising the voltage up to 220 V at a fixed current and maintaining this voltage for one hour. Thus, an anodic oxide having a thickness of 1500 to 3500 Å, for example 2000 Å was formed.

Figure 3D:
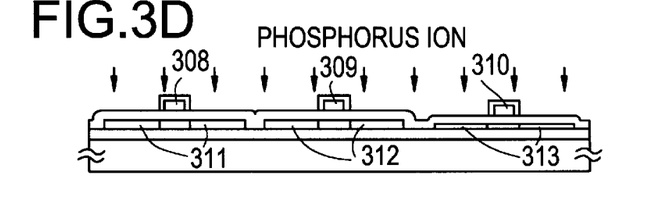

Then, as shown in FIG. 3(D), impurities were self-alignedly injected into the insular silicon films 304, 305 and 306 by ion doping with the gate electrodes 308, 309 and 310 as a mask. On this occasion, phosphorus was injected into the front surface with phosphine gas ($PH_3$) as the doping gas to form N type impurity regions 311, 312 and 313.

Figure 3E:
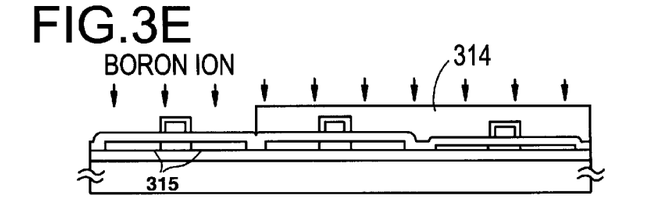

Then, as shown in FIG. 3(E), a part where an N channel type TFT was formed was covered with a photoresist 314, and boron was injected into a part where a P channel type TFT was formed with diborane ($B_2H_6$) as the doping gas, causing the N type impurity region 311 to be reversed, whereby a P type impurity region 315 was formed. Here, the dose amount of phosphorus was set to 2 to $8 \times 10^{15}$ atoms $cm^2$, the accelerating voltage to 80 kV, the dose amount of boron to 4 to $10 \times 10^{15}$ atoms $cm^{-2}$, and the accelerating voltage to 65 kV.

Further, a KrF excimer laser (wavelength: 248 nm, pulse duration: 20 nsec) was used to activate the impurity regions 312, 313 and 315. The suitable energy density of the laser was 200 to 400 mJ/$cm^2$, preferably 250 to 300 mJ/$cm^2$.

Next, a silicon oxide film 316 was formed as an interlayer insulating film 316 to a thickness of 3000 Å by plasma CVD.

Figure 3F:
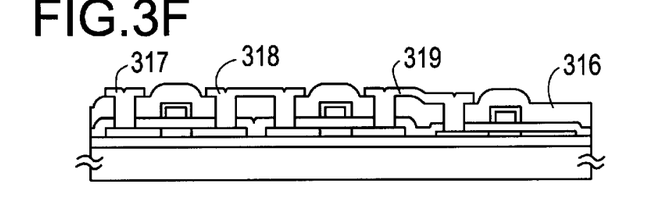

The interlayer insulating film 316 and the gate insulating film 307 were then etched to form contact holes to the source and the drain. Then, as shown in FIG. 3(F), an aluminum film was formed by sputtering, and patterned to form source and drain electrodes 317, 318 and 319.

Figure 3G:
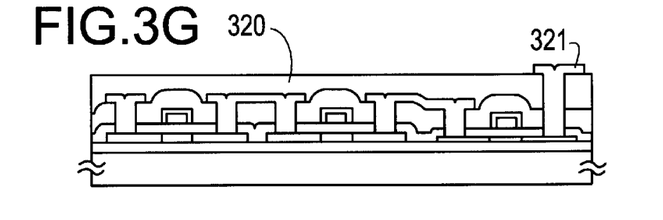

Lastly, a silicon nitride film having a thickness of 2000 to 6000 Å, for example 3000 Å was formed as a passivation film 320 by plasma CVD, and this, the silicon oxide film 316 and the gate insulating film 307 were etched to form contact holes to the impurity region 313. Then, as shown in FIG. 3(G), an indium tin oxide film (ITO film) was formed and etched to form a pixel electrode 321.

Thus, the shift register circuit and the pixel TFT in the peripheral circuit were formed.

In the present preferred embodiment, since a silicon layer having small leak current and a thin active layer was used in the pixel TFT, and a silicon film having a relatively thick active layer was used in circuits such as the shift register of which a large ON current was required, whereby a semiconductor integrated circuit could be constituted, the characteristics of the whole circuit could be improved.

Preferred Embodiment 4

The present preferred embodiment is shown in FIGS. 8(A) to 8(F) and FIGS. 9(A) to 9(F). The present preferred embodiment shows an example in which the present invention was applied to the production of a CMOS element and a switching transistor (pixel TFT) for an active matrix each used for a shift register circuit in the peripheral circuit of a TFT type liquid crystal display unit.

First, a silicon oxide film 402 was formed as a base oxide film to 1000 to 5000 Å, for example 2000 Å on a substrate 401 by sputtering. Then, an amorphous silicon film was formed to 400 to 1500 Å, for example 600 Å by plasma CVD and was then crystallized.

Figure 8A:
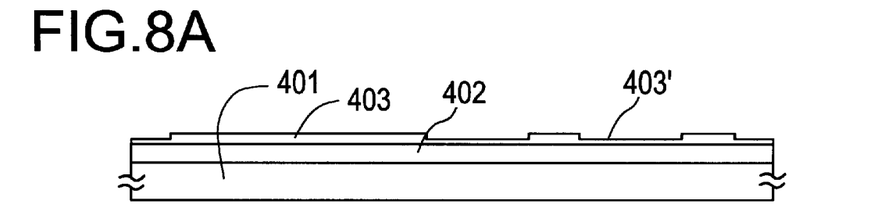
FIGS. 8(A) to 8(F) show a production method of a TFT circuit according to the present invention (cross-sectional drawing, Preferred Embodiment 4)

Next, as shown in FIG. 8(A), a mask was formed on the crystalline silicon film 403 thus obtained in the same manner as that in Preferred Embodiment 2, and a channel-forming region in an active matrix circuit and the periphery of all the TFT-forming regions were thinned to form a thin silicon region 403'. The thickness of the silicon film in the thin silicon region was set to 300 Å. Etching was carried out by the same method as that in Preferred Embodiment 2. The peripheral region of the insular region was thinned here to prevent a periphery which forms a channel region from being excessively etched in forming an insular region in a later process.

Thereafter, the crystalline silicon film 403 thus obtained was etched to form insular regions 404 and 405 (insular silicon film). Here, etching was applied only to the region 403' which had been thinned previously.

Figure 10A:
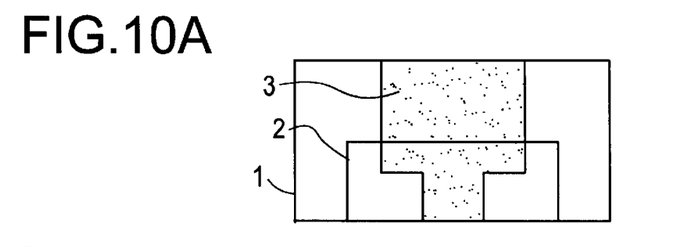
FIGS. 10(A) to 10(G) show an etching step of an insular region according to the present invention (Preferred Embodiment 4)

The effects of the above will be briefly explained with reference to FIG. 10. It is shown in FIGS. 10(A) to (D) that the periphery of the insular region was formed without thinning it as was the case with Preferred Embodiment 2. FIGS. 10(A) and (B) show the state before the silicon film is etched. In the same drawings, a region 2 which has been thinned to a thickness of 300 Å is formed on a region 1 having a thickness of 600 Å by the same thinning process as that described above. The oblique line parts 3 in the drawings show the pattern of the insular region 2, and the parts excluding this are to be etched. Etching is promoted here.

Figure 10B:
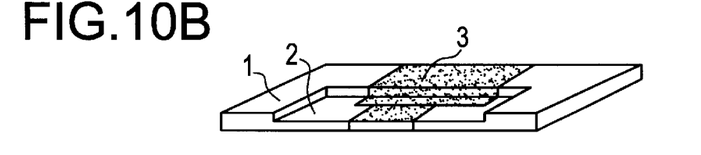
Figure 10C:
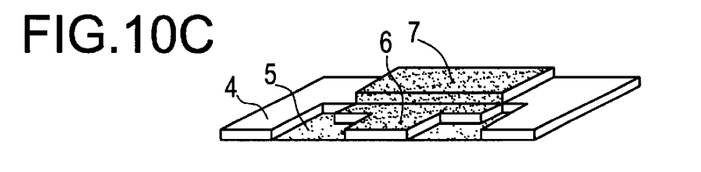

First, the state after which the silicon film was etched by 300 Å is shown in FIG. 10(C). At this time, since the silicon films are not etched in the region of the parts 6 and 7 where the insular regions are formed, they have the same film thicknesses (each 300 Å and 600 Å) as before. Here, the region 6 is a region where a gate electrode will be formed later, and a small level difference in the insular region is desired. On the other hand, in the region 1 having a thickness of 600 Å in FIG. 10(B), the silicon film is etched to be thinned to a silicon region 4 having a thickness of about 300 Å.

On the other hand, the region 2 having a thickness of 300 Å in FIG. 10(B) has the whole silicon film etched, and a surface 5 of the base oxide film exposed, as shown in FIG. 10(C). However, the silicon region 4 and the regions 6 and 7 are still connected and require further etching.

Figure 10D:
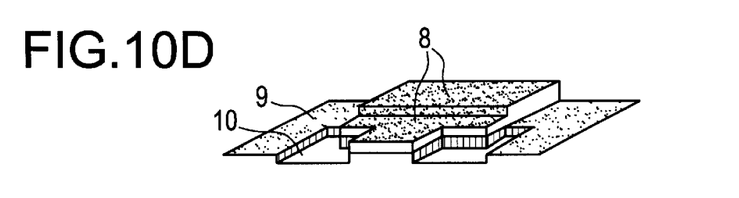

Further, etching of the silicon film by 300 A provides the state shown in FIG. 10(D). In FIG. 10(C), the region 4 where the silicon film of 300 Å remained has the whole silicon film just etched, and a base oxide film surface 9 is exposed. However, the base oxide film surface, region 15 as illustrated in FIG. 10(C), is etched more deeply in the base oxide layer and is shown as region 10 in FIG. 10(D). Accordingly, a level difference between the part 6 where the thickness was 300 Å among the insular regions 8 and the base oxide film has at least about 400 Å even in the preferred condition that an etching ratio of silicon to silicon oxide is 3:1. This level difference varies according to the selection ratio of silicon to silicon oxide in etching. While the insular region was thinned, the level difference was hardly improved, and it was difficult to make, the gate insulating film thinner (for example, 500 Å or less).

Figure 10E:
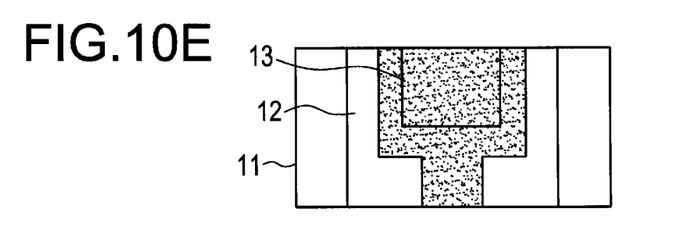
Figure 10F:
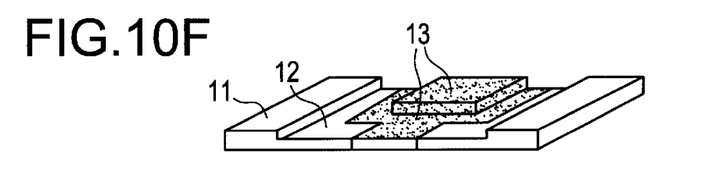
Figure 10G:
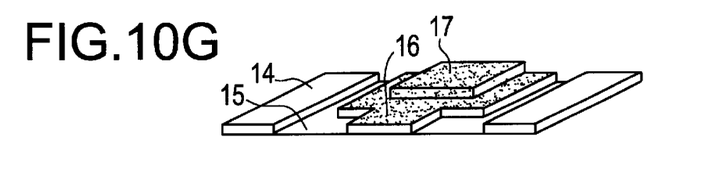

According to the present-preferred embodiment, the above point can be improved by thinning an insular region periphery. The aspect of the present preferred embodiment is shown in FIGS. 10(E) to (G). Similarly to FIG. 10(A), a silicon region 11 having a thickness of 600 Å is thinned to provide a silicon region 12 having a thickness of 300 Å. The stippled regions illustrating part 13 is the pattern of the insular region. As can be seen illustrated in FIG. 10(F), the whole periphery of the insular region 13 is turned to a thinned silicon film.

Promoting etching in this state causes a base silicon oxide surface 15 to be exposed at the time when etching is done by 300 Å. On that occasion, the thicknesses of part 17 which had a thickness of 600 Å and a part 16 which had a thickness of 300 Å in the insular region remained as they were. The peripheral region of the insular region is just in the state that the whole silicon film has been etched and in the state that it is separated from a circumferential silicon region 14. Thus, the insular region is completed. The silicon region 14 was a silicon region having a thickness of 600 Å in FIG. 10(F), and the etching thereof makes the thickness about 300 Å. To consider a level difference, the level difference between a region 16 on which a gate electrode is formed and the base oxide film surface has just a thickness corresponding to that of the region 16 (that is, 300 Å), and forming thereon a gate insulating film having a thickness of 600 Å provides no problems.

With respect to thinning of a silicon film in the preferred embodiment described above, the film thickness was reduced only to a half. If the film thickness is reduced to, for example, ¼ or less, the effect provided by thinning the peripheral part of the insular region as is the case with the present preferred embodiment is marked. For example, to consider the case where a silicon film of 800 Å is thinned to 200 Å, in the case of Preferred Embodiment 2, a level difference is 350 Å obtained by adding the depth 150 Å of silicon oxide which was overetched to 200 Å even in a very preferred case that the etching selection ratio of silicon to silicon oxide is 4:1. In the case of the present preferred embodiment, the level difference is 200 Å, and the level difference is larger by 75% in Preferred Embodiment 2 than in the present preferred embodiment.

Etching was carried out in the manner described above to form the insular regions. Each of them is used as an active layer for a TFT; the former is used for a circuit of a shift register or the like in a peripheral driving circuit, and the latter is used as a pixel TFT in an active matrix circuit. Then, a silicon oxide film 406 having a layer thickness of 200 to 800 Å, for example 500 Å was formed as a gate insulating film by plasma CVD.

Figure 8B:
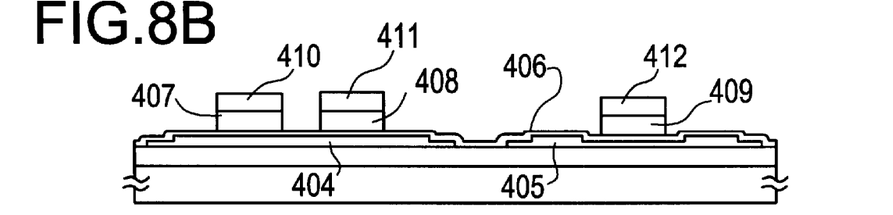

Then, as shown in FIG. 8(B), an aluminum film having a thickness of 1000 Å to 3 $\mu$m, for example, 5000 Å was formed by sputtering, and photoresist was formed by spin coating. Forming an aluminum oxide film having a thickness of 100 to 1000 Å by anodic oxidation before forming the photoresist improves the adhesion of the photoresist. The photoresist and the aluminum film were then patterned to form the gate electrodes 407, 408 and 409. The photoresist was not removed after finishing etching and was allowed to remain as the mask films 410, 411 and 412 on the respective gate electrodes.

Figure 8C:
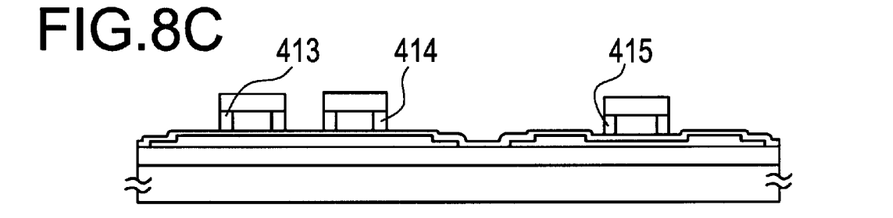

Further, current was passed through it in an electrolyte to effect porous anodic oxidation to form the porous anodic oxides 413, 414 and 415 having a thickness of 3000 to 6000 Å, for example, 5000 Å. Porous anodic oxidation can be carried out using 3 to 20% acid aqueous solutions of citric acid or oxalic acid, phosphoric acid, chromic acid and sulfuric acid, and fixed voltage of 5 to 30 V can be applied to the gate electrode. In the present preferred embodiment, anodic oxidation was carried out in an oxalic acid solution (30° C.) at the voltage of 10 V for 20 to 40 minutes. The thickness of the porous anodic oxide was controlled by the time for carrying out the anodic oxidation.

Figure 8D:
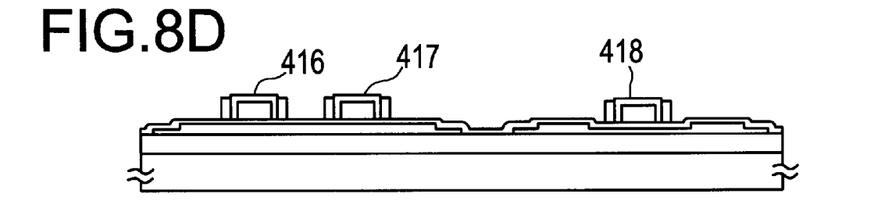

Then, as shown in FIG. 8(D), the masks 410, 411 and 412 were removed, and anodic oxidation was carried out in the same manner as that in the preferred embodiment. That is, the substrate was dipped in a 1 to 3% ethylene glycol solution of tartaric acid of pH about 7, and anodic oxidation was promoted with platinum as a cathode and the aluminum gate electrodes 407, 408 and 409 as anodes while gradually raising the voltage. The anodic oxide coat thus formed is minute and has pressure resistance. In particular, it is called barrier type anodic oxide. In the present preferred embodiment, the barrier type anodic oxides 416, 417 and 418 having a thickness of 1500 to 3500 Å, for example 2000 Å were formed.

Figure 8E:
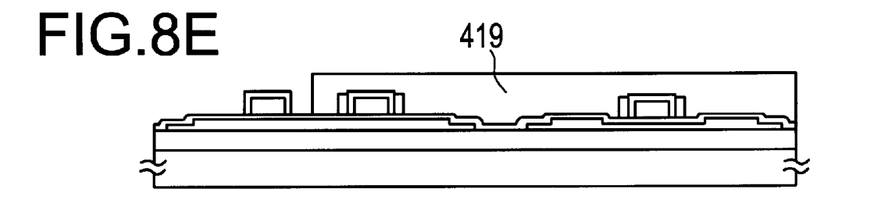

Next, as shown in FIG. 8(E), a region where an N channel type TET and a pixel TFT in a peripheral circuit were formed was covered with a mask 419, and the porous anodic oxide 413 of a P channel type TFT in the peripheral circuit was etched. On this occasion, a mixed acid of phosphoric acid, acetic acid and nitric acid was used as an etchant.

Figure 8F:
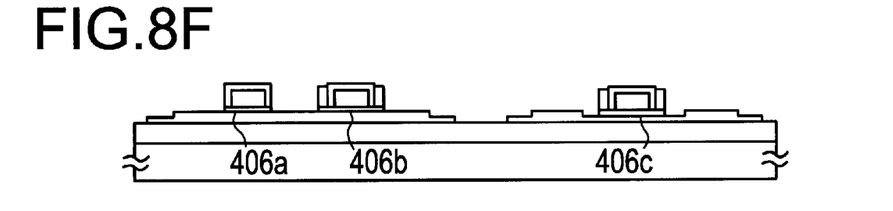

Then, the mask 419 was removed, and the gate oxide film 406 was etched by dry etching. On this occasion, by using $CH_4$ as etching gas, the anodic oxides were not etched, and only the silicon oxide film 406 was etched. As a result, as shown in FIG. 8(F), the silicon oxide film under the porous anodic oxides 414 and 415 was etched, and 406a, 406b and 406c were left.

Figure 9A:
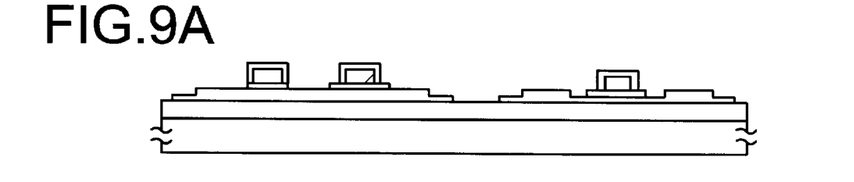
FIGS. 9(A) to 9(F) show a production method of a TFT circuit according to the present invention (cross-sectional drawing, Preferred Embodiment 4)

Then, as shown in FIG. 9(A), the porous anodic oxides 414 and 415 of the N channel type TFT and the pixel in the peripheral circuit were etched.

Figure 9B:
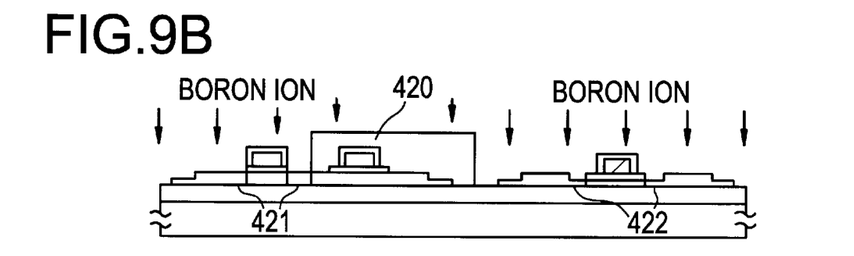

Thereafter, as shown in FIG. 9(B), the region of the N channel type TFT in the peripheral circuit was covered with a mask 420, and impurities were injected into a silicon film in the region of the P channel type TFT and an insular region 405 in the peripheral circuit in a self-aligned manner with a gate electrode part (gate electrode, barrier anodic oxide and silicon oxide film) as a mask by ion doping. Here, boron was injected with diborane ($B_2H_6$) as the doping gas, whereby the P type impurity regions 421 and 422 were formed. On this occasion, the dose amount of boron was set to 1 to $4\times10^5$ atoms $cm^{-2}$, and the accelerating voltage to 10 kV. Herein, since the accelerating voltage was low, the lower part of the gate oxide film 406c was not doped, and boron was not introduced.

Figure 9C:
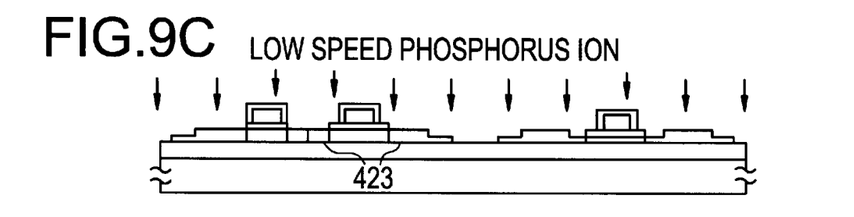

Then, as shown in FIG. 9(C), the mask 420 was removed, and phosphorus was injected into a front surface with phosphine gas ($PH_3$) as the doping gas to form an N type impurity region 423 in the region of the N channel type TFT in the peripheral circuit. Here, the dose amount of phosphorus was set to 1 to $8\times10^{14}$ atoms $cm^{-2}$, and the accelerating voltage to 5 kV. Here, since the accelerating voltage was low, the lower part of the gate oxide film 406b was not doped, and phosphorus was not introduced. Further, since the dose amount of phosphorus was low as compared with that of boron, the impurity regions 421 and 422 of the P channel type TFT and the pixel TFT in the peripheral circuit remained P-type impurity regions.

Figure 9D:
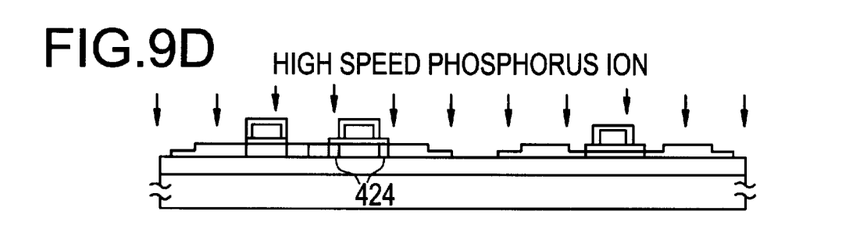

Then, as shown in FIG. 9(D), with the dose amount of phosphorus set to $1\times10^{13}$ to $1\times10^{14}$ atoms $cm^{-2}$ and the accelerating voltage to 90 kV, phosphorus was introduced into the lower part of the gate oxide film 406b which had not been doped in the region of the N channel type TFT in the peripheral circuit, whereby a low concentration drain 424 (LDD, $N^-$type) was formed.

Further, a KrF excimer laser (wavelength: 248 nm, pulse width: 20 nsec) was used to activate the impurity regions 421, 422, 423 and 424. The energy density of the laser was suitably 200 to 400 mJ/cm$^2$, and preferably 250 to 300 mJ/cm$^2$. On this occasion, a PI junction present under the gate oxide film 406c in the pixel TFT was sufficiently activated by laser irradiation. However, sufficient laser irradiation cannot be expected to a PI junction and a N$^-$ junction of a TFT in the peripheral circuit.

Accordingly, annealing was further carried out at 350 to 550° C. after the laser irradiation process to promote the activation of the junctions described above. Here, since the thickness of the active layer of the TFT in the peripheral circuit was as thick as 500 Å, crystallization proceeded from a channel-forming region (I type) to a P type and a N$^-$ type in the periphery, and a good PI junction and N$^-$ junction were obtained.

Next a silicon oxide film 425 was formed as an interlayer insulating film to a thickness of 3000 Å by plasma CVD.

Then, the interlayer insulating film 425 and the gate insulating film 406 were etched to form contact holes to a source and a drain. An aluminum film was then formed by sputtering and patterned to form the source and drain electrodes 426, 427, 428 and 429.

Figure 9E:
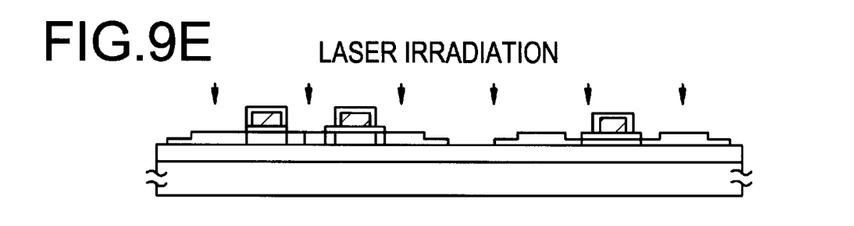

Lastly, as shown in FIG. 9(E), a silicon nitride film having a thickness of 2000 to 6000 Å, for example 3000 Å was formed as a passivation film 430 by plasma CVD, and this, the silicon oxide film 425 and the gate insulating film 406 were etched to form contact holes to the impurity region 422. Then, an indium tin oxide film (ITO film) was formed and etched to form a pixel electrode 431.

Figure 9F:
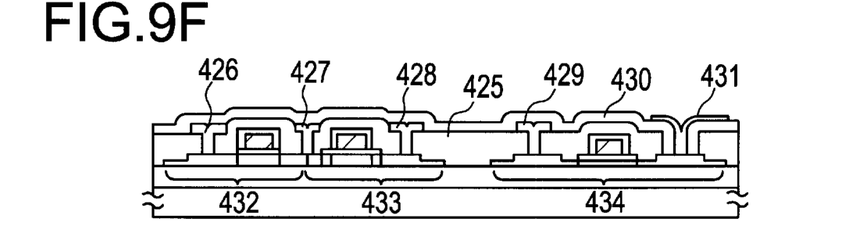

Thus, a CMOS element constituted by a TFT 433 having a conventional P channel type TFT 432 and an N channel type LDD in the peripheral circuit, and a pixel TFT 434 having a P channel type offset region were formed.

In the present preferred embodiment, the thickness of the gate oxide film could be 500 Å which was about a half of conventional ones. As a result, both the pixel TFT and peripheral circuit could show excellent characteristics as compared with those of conventional ones.

A TFT having excellent characteristics can be obtained by the present invention. As shown in the preferred embodiments, semiconductor integrated circuits of optimum construction can be constituted as well by employing the present invention. The present preferred embodiments were explained giving a silicon semiconductor as an example, but it is self-explanatory that it can be replaced with other semiconductors. As described above, the present invention is industrially useful and is qualified enough to be granted to a patent.

What is claimed is:

1. A method for forming a semiconductor device comprising the steps of:

forming a semiconductor film comprising silicon on an insulating surface;

crystallizing said semiconductor film; and thinning at least a portion of the crystallized semiconductor film to become a channel-forming region to a thickness of 300 Å or less;

patterning the crystallized semiconductor film into a marker part for aligning a mask and an insular semiconductor part at the same time.

2. A method for forming a semiconductor device comprising the steps of:

forming a semiconductor film comprising silicon on an insulating surface;

crystallizing said semiconductor film;

thinning at least a portion of the crystallized semiconductor film to become a channel-forming region to a thickness of 300 Å or less;

patterning the crystallized semiconductor film into a marker part for aligning a mask and an insular semiconductor part at the same time; and forming a transistor comprising a source region, a drain region and a channel-forming region formed in said insular semiconductor part, said channel-forming region being formed between said source region and said drain region.

3. A method for forming a semiconductor device comprising the steps of:

forming a semiconductor film comprising silicon on an insulating surface;

crystallizing said semiconductor film;

thinning at least a portion of the crystallized semiconductor film to become a channel-forming region to a thickness of 300 Å or less;

patterning the crystallized semiconductor film into a marker part for aligning a mask and an insular semiconductor part at the same time;

forming a gate insulating film over said marker part and said insular semiconductor part;

forming a gate electrode on said gate insulating film; and forming a source region and a drain region by introducing a dopant into said insular semiconductor part using a mask comprising said gate electrode to thereby form a channel-forming region adjacent to said gate electrode and between said source region and said drain region.

4. A method for forming a semiconductor device comprising the steps of:

forming a semiconductor film comprising silicon on an insulating surface;

crystallizing said semiconductor film by heat treatment;

irradiating the crystallized semiconductor film with a laser light;

thinning at least a portion of the crystallized semiconductor film to become a channel-forming region to a thickness of 300 Å or less after said irradiating step;

patterning the crystallized semiconductor film into a marker part for aligning a mask and an insular semiconductor part at the same time after said irradiating step;

forming a gate insulating film over said marker part and said insular semiconductor part;

forming a gate electrode on said gate insulating film; and forming a source region and a drain region by introducing a dopant into said insular semiconductor part using a mask comprising said gate electrode to thereby form a channel-forming region adjacent to said gate electrode and between said source region and said drain region.

5. A method for forming a semiconductor device comprising the steps of:

forming a semiconductor film comprising silicon on an insulating surface;

crystallizing said semiconductor film;

thinning at least a portion of the crystallized semiconductor film to become a channel-forming region to a thickness of 300 Å or less;

patterning the semiconductor film into a marker part for aligning a mask and an insular semiconductor part which includes said portion to become said channel-forming region, at the same time;

forming a gate insulating film over said marker part and said insular semiconductor part;

forming a gate electrode on said gate insulating film; and forming a source region and a drain region by introducing a dopant into said insular semiconductor part using a mask comprising said gate electrode to thereby form said channel-forming region adjacent to said gate electrode and between said source region and said drain region.

6. A method for forming a semiconductor device comprising the steps of:

forming a semiconductor film comprising silicon on an insulating surface;

crystallizing said semiconductor film;

thinning at least a portion of the crystallized semiconductor film to become a channel-forming region to a thickness of 300 Å or less;

patterning the semiconductor film into a marker part for aligning a mask and an insular semiconductor part which includes said portion to become said channel-forming region, at the same time;

forming a gate insulating film having a thickness of 500 Å or less over said marker part and said insular semiconductor part;

forming a gate electrode on said gate insulating film; and forming a source region and a drain region by introducing a dopant into said insular semiconductor part using a mask comprising said gate electrode to thereby form said channel-forming region adjacent to said gate electrode and between said source region and said drain region.

7. The method of claim 1 further comprising the step of thinning the crystallized semiconductor film before said patterning step.

8. The method of claim 2 further comprising the step of the thinning of the crystallized semiconductor film before said patterning step.

9. The method of claim 4 further comprising the step of the thinning of the crystallized semiconductor film before said patterning step.

10. The method of the claim 1 wherein the crystallization is promoted by an element for promoting crystallization is promoted by an element for promoting crystallization of silicon.

11. The method of the claim 2 wherein the crystallization is promoted by an element for promoting crystallization is promoted by an element for promoting crystallization of silicon.

12. The method of the claim 3 wherein the crystallization is promoted by an element for promoting crystallization is promoted by an element for promoting crystallization of silicon.

13. The method of the claim 4 wherein the crystallization is promoted by an element for promoting crystallization is promoted by an element for promoting crystallization of silicon.

14. The method of the claim 5 wherein the crystallization is promoted by an element for promoting crystallization is promoted by an element for promoting crystallization of silicon.

15. The method of the claim 6 wherein the crystallization is promoted by an element for promoting crystallization is promoted by an element for promoting crystallization of silicon.

16. The method of claim 10 wherein said element is nickel, palladium, platinum, cobalt or iron.

17. The method of claim 11 wherein said element is nickel, palladium, platinum, cobalt or iron.

18. The method of claim 12 wherein said element is nickel, palladium, platinum, cobalt or iron.

19. The method of claim 13 wherein said element is nickel, palladium, platinum, cobalt or iron.

20. The method of claim 14 wherein said element is nickel, palladium, platinum, cobalt or iron.

21. The method of claim 15 wherein said element is nickel, palladium, platinum, cobalt or iron.

* * * * *